(12) United States Patent
Tsai et al.

(10) Patent No.: US 7,768,072 B2
(45) Date of Patent: Aug. 3, 2010

(54) SILICIDED METAL GATE FOR MULTI-THRESHOLD VOLTAGE CONFIGURATION

(75) Inventors: Ching-Wei Tsai, Taoyuan (TW);
Chih-Hao Wang, Hsin-Chu (TW);
Wei-Jung Lin, Taipei (TW);
Huan-Tsung Huang, Hsin-Chu (TW);
Carlos H. Diaz, Mountain View, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 116 days.

(21) Appl. No.: 11/728,809

(22) Filed: Mar. 27, 2007

(65) Prior Publication Data

US 2008/0237750 A1 Oct. 2, 2008

(51) Int. Cl.
*H01L 29/94* (2006.01)
(52) U.S. Cl. .................. 257/368; 257/388; 257/392
(58) Field of Classification Search .................. 257/213, 257/365, 410, 369, 388, 392
See application file for complete search history.

(56) References Cited

U.S. PATENT DOCUMENTS

| | | | |
|---|---|---|---|
| 6,030,863 A | 2/2000 | Chang et al. | |
| 6,365,446 B1 | 4/2002 | Chong et al. | |
| 6,475,874 B2 | 11/2002 | Xiang et al. | |
| 6,528,981 B1 * | 3/2003 | Tsubaki | 323/315 |
| 6,905,922 B2 | 6/2005 | Lin et al. | |
| 7,067,379 B2 | 6/2006 | Wen et al. | |
| 7,078,278 B2 | 7/2006 | Pan et al. | |
| 7,141,467 B2 | 11/2006 | Hokazono et al. | |
| 7,151,023 B1 | 12/2006 | Nayfeh et al. | |
| 2004/0201066 A1 | 10/2004 | Han | |
| 2005/0009328 A1 | 1/2005 | Park et al. | |
| 2005/0148114 A1 * | 7/2005 | Rhodes | 438/120 |
| 2006/0017112 A1 | 1/2006 | Wang et al. | |
| 2006/0043497 A1 * | 3/2006 | Kimizuka et al. | 257/388 |
| 2006/0163661 A1 * | 7/2006 | Wang et al. | 257/369 |
| 2006/0194393 A1 * | 8/2006 | Muto | 438/275 |
| 2008/0029822 A1 * | 2/2008 | Tsuchiya et al. | 257/369 |

* cited by examiner

*Primary Examiner*—Marcos D Pizarro
*Assistant Examiner*—Tifney L Skyles
(74) *Attorney, Agent, or Firm*—Slater & Matsil, L.L.P.

(57) ABSTRACT

A PMOS (p-channel metal oxide semiconductor) device having at low voltage threshold MOSFET (MOS field effect transistor) with an improved work function and favorable DIBL (drain-induced barrier lowering) and SCE (short channel effect) characteristics, and a method for making such a device. The PMOS device includes a gate structure that is disposed on a substrate and includes a silicided gate electrode. The silicide is preferably nickel-rich and includes a peak platinum concentration at or near the interface between the gate electrode and a dielectric layer that separates the gate electrode from the substrate. The platinum peak region is produced by a multi-step rapid thermal annealing or similar process. The PMOS device may also include two such MOSFETs, one of which is boron-doped and one of which is not.

20 Claims, 8 Drawing Sheets

SILICIDED METAL GATE FOR MULTI-THRESHOLD VOLTAGE CONFIGURATION

TECHNICAL FIELD

The present invention relates generally to the field of semiconductor devices, and more particularly relates to a PMOS device having a fully-silicided metal gate that may be used advantageously, for example in a multi-threshold IC (integrated circuit) application, and to a method for fabricating such a device.

BACKGROUND

Small electronic appliances are today used in a wide variety of applications and have become a ubiquitous part of modern society. These applications include computers, telephones, and home entertainment system components, among many others. One reason for the widespread use of these appliances is that recent advances in technology have expanded their capabilities while at the same time lowering their cost. A key part of this advancing technology has been the development of improved semiconductor devices and the processes for making them.

Semiconductors are materials that after being properly treated conduct electricity when placed under certain conditions, which often include the presence of a small electrical charge. This enables the manufacture of solid-state switches—those that have no moving parts. Other standard (and new) electrical devices can be created out of semiconductors as well. In addition to having no moving components parts that are subject to fatigue or other mechanical failure, solid-state devices can be fabricated in extremely small sizes. Very small, even microscopic electrical components are now used to provide the multitude of resistors, switches, and capacitors necessary for today's electronics applications.

The processes used to fabricate these tiny semiconductor devices are numerous, but the basic process may be described generally. A material, such as silicon, is produced for use as a base, or substrate, upon which various electrical components will be built. This material is then formed into an appropriate shape, usually a thin slice called a wafer. The pure silicon is then selectively treated with one or more materials called dopants, such as ionized boron or phosphorus. The introduction of these impurities begins the process of creating the desired semiconductive properties. Various structures may then be formed at or near one surface of the wafer to construct the desired components.

An exemplary semiconductor device, in this case a transistor, is shown in FIG. 1. FIG. 1 is an illustration showing in cross-section the basic components of a MOSFET (metal-oxide semiconductor field effect transistor) 10. In this example, silicon forms the substrate 15 upon which various devices may be fabricated. The transistor includes a gate 20 having a gate electrode 25 the gate electrode made of a conductive material such as polycrystalline silicon (poly) or a metal. Separating the gate electrode from the substrate 15 is a thin gate dielectric layer 30. In the transistor 10 of FIG. 1, spacers 35 are positioned on either side of the gate electrode 25. Conductive regions called a source 40 and a drain 45 are formed in the substrate 15 on either side of the spacers 35. Source 40, drain 45, and gate electrode 25 are each coupled, respectively, to electrical contacts 50, 51, 52, each of which may in turn be connected to external components (not shown) so that electrical current may flow to and from these transistor components when appropriate. When a small electrical charge is applied to gate electrode 25 via contact 52, then current may flow between drain 45 and source 40 via channel region 5.

All of the transistors in a particular application need not be, and usually are not identical. For example, a MOSFET having a source region and drain region doped with boron ions creates a p-channel device (having positive charge carriers and activated by a negative gate voltage), often referred to as a PMOS device. An NMOS device, on the other hand, has a source region and drain region created with an n-type dopant such as phosphorous ions. These two types of MOSFETs may be use to advantage in pairs, creating a CMOS (complimentary-MOS) device. CMOS devises, combined with appropriate logic configurations, result in significant power savings and are currently widely used throughout the semiconductor industry.

As another example, MOSFETs may be fabricated to have either a higher or a lower threshold voltage, relative to each other. A multi-threshold device has both, and these may be used to advantage where application logic is available to choose the most appropriate type for a given operation. Multiple threshold voltage processes offer a way to reduce total power consumption while maintaining performance. A low transistor threshold voltage may be used on critical-path operations to meet timing constraints. Other operations may be assigned a higher threshold voltage to reduce the sub-threshold leakage component of static power consumption. Multiple threshold voltage transistor devices are becoming popular and are frequently used.

These MOSFET transistors are very small, for example, gate length (distance between the source and the drain) of MOSFET 10 may be no more than 100 nm in width. As gates become smaller, certain undesirable characteristics become more pronounced. Problems caused in this manner are sometimes labeled short-channel effects (SCE). In some cases, these SCE problems may be mitigated or avoided through the use of new types of materials. The gate electrode, for example, has traditionally been made out of polysilicon, though many metals may be used instead and has better performance characteristics in certain areas. On the other hand, metals may present more challenges in the fabrication process.

One material that is now used in an attempt to optimize gate performance is referred to as a silicide. A silicide is basically an alloy of poly and a metal such as nickel, titanium, or cobalt. Silicides are sometimes used to create contacts, typically at the top of a gate electrode or a source or drain. They may, however, be used for the entire gate electrode. One way to fabricate such a gate electrode is to begin with a conventional poly gate, and then overlay the poly gate electrode with one or more metal layers after the remaining features have been masked with a dielectric or photoresist. The entire structure is then annealed, that is sufficiently heated for a sufficient length of time in order to combine all of the poly with the metal, down to the gate dielectric. A gate constructed in this or similar fashion is sometimes referred to as a fully-silicided (FUSI) gate because all of the poly material is consumed in the process.

These FUSI metal gates perform satisfactorily in many respects, but sometimes present a problem with attaining the proper work function, especially in PMOS devices. The work function basically describes the energy needed to move an electron in the solid atom from an initial Fermi energy level to vacuum level, that is, to outside the atom. Work function is a metric commonly applied to gate structures in transistors. An un-silicided poly gate, for example, commonly has a work function of approximately 5.0 eV. The work function in effect determines the threshold voltage at which the device will turn on or turn off. Silicided PMOS devices are frequently not able to obtain an acceptably high work function of, for example, 4.8 eV. This may result in a higher device threshold voltage, for example 0.2V, which may frustrate applications involving low-threshold-voltage logic.

Needed then is a way to achieve the advantages gained through the use of FUSI metal gates in semiconductor devices such as transistors while at the same time achieving a desirable work function that will permit exploitation of multi threshold voltage applications without the need for more (or more extensive) pocket or channel implants. The present invention provides just such a solution.

SUMMARY OF THE INVENTION

These and other problems are generally solved or circumvented, and technical advantages are generally achieved, by preferred embodiments of the present invention, which are directed to a PMOS device that uses a fully-silicided (FUSI) metal gate having a desirable work function value.

In accordance with a preferred embodiment of the present invention, a PMOS device includes a gate structure fabricated on a substrate, adjacent to a source region and a drain region that are formed in or on the substrate. The gate structure includes a gate electrode separated from the substrate by a dielectric material. The gate electrode, which is preferably less than 1000 Å in thickness, comprises a boron-doped silicide to form a low threshold voltage gate. The silicide is an alloy of polycrystalline silicon (poly), nickel and platinum. The silicide is formed in rapid thermal anneal (RTA) process that leaves a peak platinum region at or near the interface between the gate dielectric and the gate electrode. In one multi-threshold embodiment, the PMOS device also includes a second gate structure fabricated on the substrate adjacent to a second source region and a second drain region. The second gate structure is fabricated identically or similar to the first gate structure described above, except that the gate electrode is not boron doped. In this embodiment, the first or sole gate forms a low threshold voltage MOSFET, and the second gate forms a high threshold voltage MOSFET.

In accordance with another preferred embodiment of the present invention, a method for fabricating a semiconductor device comprises providing a substrate, fabricating a gate structure on the substrate, the gate structure having a gate dielectric and a gate electrode, wherein the gate electrode comprises a boron-doped silicide to form a low threshold voltage gate. The silicide is formed by forming a poly gate portion, doping the poly gate portion with boron, forming a metal layer of nickel and 5% platinum over the poly portion, and forming a layer of titanium nitrate over the nickel-platinum layer. The process continues with performing a first RTA, removing any un-reacted metal, and performing a second RTA to form a fully-silicided (FUSI) gate electrode. A source region and a drain region are formed in the substrate adjacent to the gate structure. The method may also include forming on the substrate a second PMOS gate structure having a nickel-rich platinum silicon gate electrode having a platinum peak at or near the interface of the second gate structure and a gate dielectric layer that separates the second gate structure from the substrate. A second source region and a second drain region are formed adjacent to the second gate structure to create a high threshold voltage PMOS device.

An advantage of a preferred embodiment of the present invention is the PMOS device may be used in a multi threshold environment, using a high threshold voltage PMOS device similar or identical to the low threshold voltage device except that it is not boron doped.

As more complete appreciation of the present invention and the scope thereof can be obtained from the accompanying drawings that are briefly summarized below, the following detailed description of the presently preferred embodiments of the present invention, and the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a PMOS device having a nickel-rich fully silicided (FUSI) metal gate. A nickel-rich FUSI metal gate is one in which substantially all of the original poly has been consumed in the silicidation process, and where the resulting gate electrode material has more nickel than silicon. The invention may also be applied, however, to PMOS devices made of similar material as well. The PMOS device may, for example, be one of the transistors in a CMOS (complementary metal-oxide semiconductor) device, which typically also includes an NMOS device as well. Although the present invention provides little or no advantage for NMOS devices, it is of advantage to the overall CMOS device in which the two (or more) transistors are incorporated.

Figure 1:
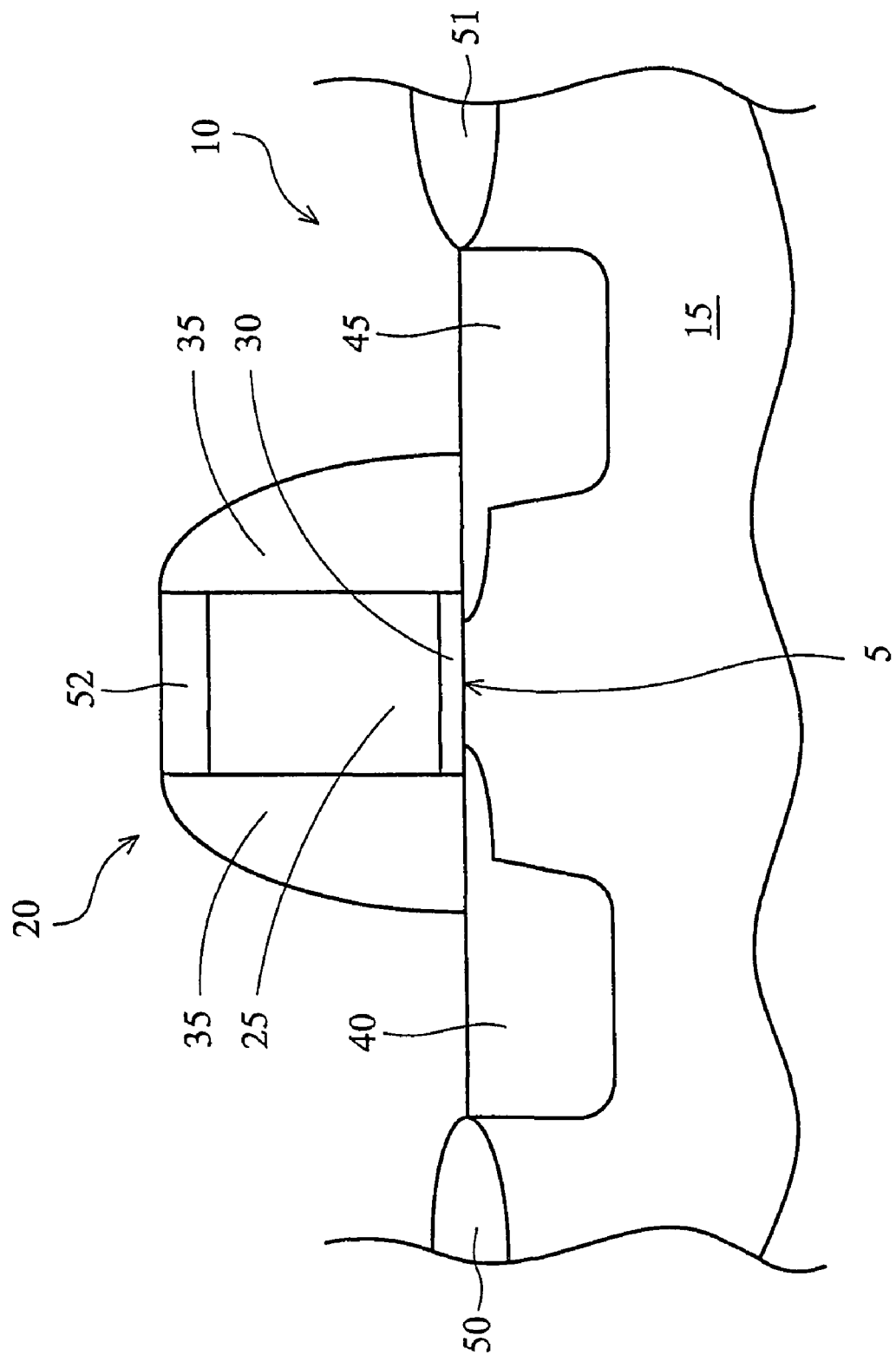
FIG. 1 is an illustration showing in cross-section the basic components of a MOSFET (metal-oxide semiconductor field effect transistor).
Figure 2:
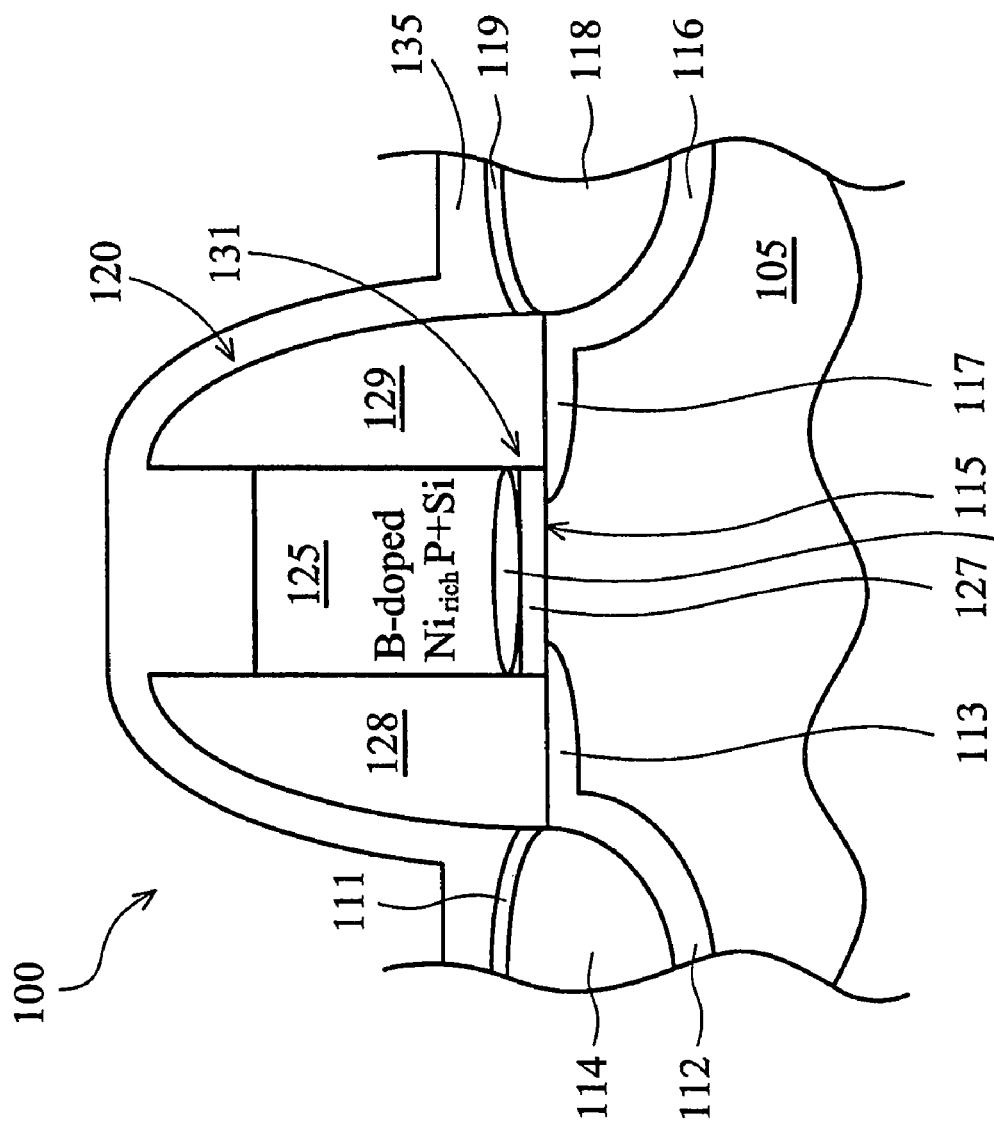
FIG. 2 is an illustration showing in cross-section the basic components of a PMOS (p-channel metal-oxide semiconductor) device according to an embodiment of the present invention.

In one embodiment the present invention is a low threshold voltage device. As explained above, many semiconductor devices include both high and low threshold voltage devices in view of the power-saving advantages that may be obtained through their application. On such low voltage threshold device is illustrated in FIG. 2. FIG. 2 is an illustration showing in cross-section the basic components of a PMOS (p-channel metal-oxide semiconductor) device 100 according to an embodiment of the present invention. In this embodiment, PMOS device 100 includes a gate structure 120, which has been fabricated on an n-type silicon substrate 105. Source region 112 and drain region 116 have been formed in substrate 105 adjacent gate structure 120. Note that actual shape of the source region 112 and the drain region 116 may vary based on design and fabrication considerations.

In this embodiment, the source region 112 includes a shallow extension 113 that extends under the gate electrode 125 and, correspondingly, the drain region 116 includes a shallow extension 117 that extends under the gate electrode 125. The source and drain regions, including their respective extensions, define a channel 115 across which current may flow when PMOS device 100 has been activated. In the illustrated embodiment, silicon germanium (SiGe) portions 114 and 118 have been created in, source region 112 and drain region 116, respectively. This may be done to impose a physical stress region affecting surrounding materials and improving their desirable characteristics. Nickel silicide contact regions 111 and 119 have, in this embodiment, each been formed over a respective one of silicon germanium portion 114 or 118.

In the embodiment of FIG. 2, gate structure 120 includes a gate electrode 125, which is physically separated from the substrate 105 by dielectric layer 127. Spacers 128 and 129 are disposed on either side of gate electrode 125. In accordance with this embodiment of the present invention, the gate electrode 125 is formed of a fully silicided (FUSI) material, preferably a polysilicon (poly) that has been silicided with nickel and platinum. In a particularly preferred embodiment, the FUSI gate electrode 125 is nickel-rich, and includes platinum peak region 130 at or near the interface of the gate electrode 125 and the gate dielectric 126. The platinum peak region 130 preferably includes a concentration of greater than about 5% platinum compared to the nickel concentration at a location within 50 Å of the gate dielectric-electrode interface 131. A CESL (contact etch stop layer) 135 is formed over the gate structure 120 and adjacent areas, permitting further fabrication of the chip on which the device is situated to continue.

In accordance with this embodiment the gate electrode is also boron-doped. In one embodiment, a peak boron region is also formed (but not shown in FIG. 2), the peak boron region being located within about 50 Å of the interface 131. In an alternate embodiment, the peak boron region is located farther from the interface than the platinum peak region 130. In yet another alternate embodiment, both conditions are met, that is the boron peak region is located within 50 Å of the interface 131, but still further away than the platinum peak region 130. It has been found that a boron-doped nickel-rich platinum silicon metal fabricated in accordance with the parameters above may achieve a work function of about 5.04 eV and have a threshold voltage of about −0.30 volts, making it very suitable as the low voltage threshold device in a multi-threshold application. Note, however, that no particular result is a requirement of the present invention unless explicitly recited.

Figure 3:
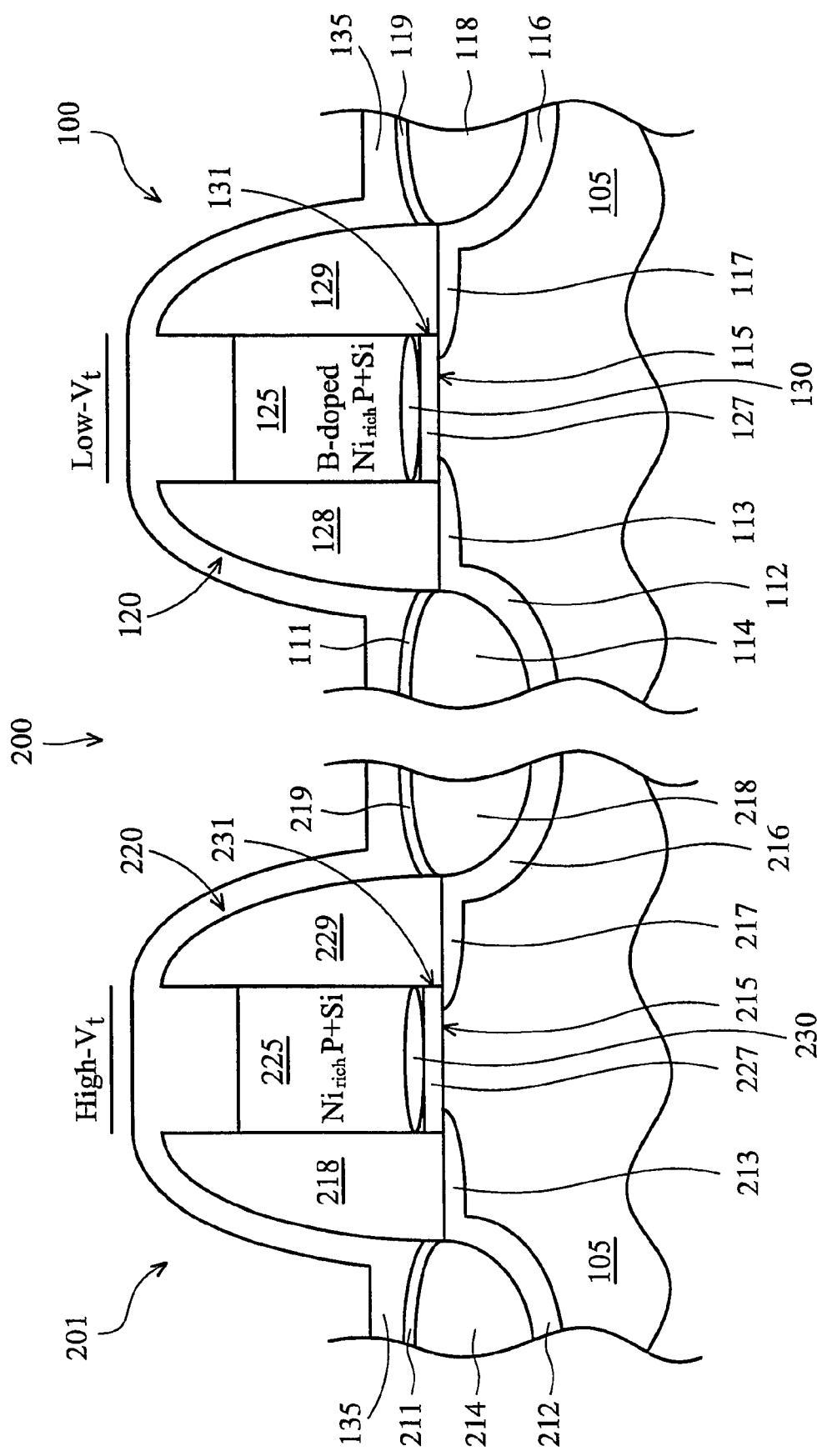
FIG. 3 is an illustration showing in cross-section the basic components of a PMOS device according to another embodiment of the present invention.

A multi threshold-voltage embodiment will now be discussed. FIG. 3 is an illustration showing in cross-section the basic components of a PMOS device 200 according to another embodiment of the present invention. This embodiment includes both a high threshold voltage device and a low threshold voltage device, such as the one described above. For convenience, the low threshold voltage device 100 is used as the low threshold voltage device in this embodiment although this specific embodiment is not required. As it used in the embodiment of FIG. 3, however, the description of features provided above with reference to FIG. 2 would not be repeated except as is deemed necessary.

In the embodiment of FIG. 3, proximate the low threshold voltage device 100 is a high threshold voltage device 201. Note, however, that no particular physical proximity between the two devices 100 and 201 is required, except as it may be necessary to the reliable function of the circuit or circuits using PMOS device 200. Again, there are typically a very large number of similar or identical device located on a single chip and no specific manner of use is required. In this embodiment, the high voltage threshold device 201 of PMOS device 200 includes a gate structure 220, which has been fabricated on substrate 105. Source region 212 and drain region 216 have been formed in substrate 105 adjacent gate structure 220. Note that actual shape of the source region 212 and the drain region 216 may vary based on design and fabrication considerations.

In this embodiment, the source region 212 includes a shallow extension 213 that extends under the gate electrode 225 and, correspondingly, the drain region 216 includes a shallow extension 217 that extends under the gate electrode 225. The source and drain regions, including their respective extensions, define a channel 215 across which current may flow when PMOS device 201 has been activated. In the illustrated embodiment, silicon germanium portions 214 and 218 have been created in, of source region 212 and drain region 216, respectively. This may be done to impose a physical stress region affecting surrounding materials and improving their desirable characteristics. Nickel silicide contact regions 211 and 219 have, in this embodiment, been each formed over a respective one of silicon-germanium portions 214 or 218.

In the embodiment of FIG. 3, gate structure 220 includes a gate electrode 225, which is physically separated from the substrate 105 by dielectric layer 227. It is noted that several of the features of device 201 represented here, for example, the gate dielectric 227, may have been formed at the same time as the corresponding feature of device 100, and are differently numbered only for clarity. Such features could, of course, also have been formed separately. Spacers 228 and 229 are disposed on either side of gate electrode 225. In accordance with this embodiment of the present invention, the gate electrode 225 is formed of a fully silicided (FUSI) material, preferably a polysilicon (poly) that has been silicided with nickel and platinum. In a particularly preferred embodiment, the FUSI gate electrode 225 is nickel-rich, and includes platinum peak region 230 at or near the interface 231 of the gate electrode 225 and the gate dielectric 227. The platinum peak region 230 preferably includes greater than about 5% platinum at a location within 50 Å of the interface 231. CESL 135, in this embodiment, also covers over the gate structure 220 and adjacent source and drain areas.

In accordance with this embodiment of the present invention, the gate electrode 225 is not boron-doped. It has been found that a the non-boron-doped nickel-rich platinum silicon metal fabricated in accordance with the parameters above may achieve a work function of about 4.93 eV and have a threshold voltage of about −0.41 volts, making it very suitable as the high voltage threshold device in a multi-threshold application. Note again, however, that no particular result is a requirement of the present invention unless explicitly recited. A method of fabricating a device according to the present invention will now be described.

Figure 4:
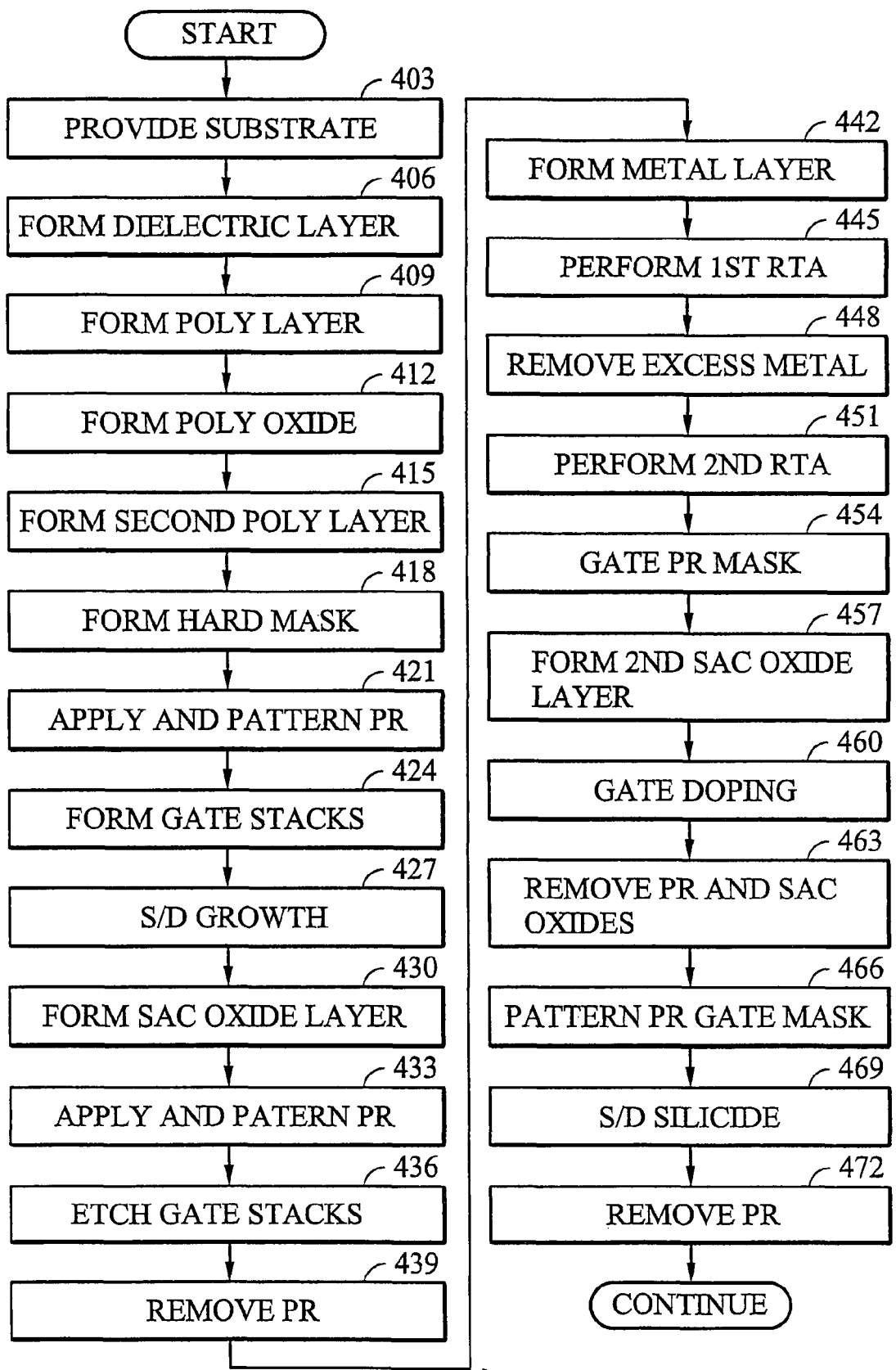
FIG. 4 is a flow diagram illustrating a method of fabricating a PMOS device according to an embodiment of the present invention.

FIG. 4 is a flow diagram illustrating a method 400 of fabricating a PMOS device according to an embodiment of the present invention. At START it is presumed that the necessary materials and the equipment operational to perform the method are available. Initially, a substrate is provided (step 403). The substrate may be silicon or some other suitable material such as silicon germanium. A relatively-thin dielectric layer is then formed on the substrate (step 406), portions of which will later form the gate dielectrics. In a preferred embodiment, the dielectric layer is formed of silicon oxynitride (SiON) using a plasma nitridation technique. Following the dielectric layer, a poly layer is formed (step 409). The poly layer is preferably about 400 Å thick.

A poly re-oxidation is then performed (step 412) to form an oxide layer about 30 Å in thickness. The oxide layer may simply be deposited or may be formed through oxidation of the surface of the existing poly material. A second poly layer may then be formed (step 415), preferably to about 800 Å in thickness. A gate hard mask layer is then deposited (step 418), and a photoresist layer is formed and patterned (step 421). The photoresist structures that remain after patterning protect those portions of the gate stack layers that are to remain to form the gate stacks themselves. The gate stacks may now be created by an etching process (step 424).

In the embodiment of FIG. 4, the etching process removes the unprotected materials that were previously deposited on the substrate, creating a gate stack. The gate stack is in this embodiment includes not only the gate dielectric and the gate electrode, but also the oxide layer formed over the gate electrode, the second poly layer, and the hard mask. Other layers may be present as well in other embodiments. In this embodiment, this etching step also includes etching recesses in the now exposed substrate adjacent to each side of each gate stack. Source and drain regions may then be formed (step 427) using an epitaxial growth process to create SiGe in the previously-formed recesses. In a preferred embodiment, the upper boundary of each source and drain region is through this process raised above the lower boundary of the adjacent gate structure with the substrate. Doping of the source and drain regions (not separately shown) may be done during the growth process or at a later time.

In the embodiment of FIG. 4, a sacrificial oxide layer is then formed (step 430), preferably to a thickness of about 300 Å. This is followed by the formation and patterning (step 433) of a photoresist layer. This patterned photoresist layer leaves exposed from above each of the gate structures, that is, this photoresist forms a layer of structures protecting the newly-formed source and drain regions. With this protection in place, an etching process is performed (step 436) such that the exposed portion of the sacrificial oxide layer and the hard mask under it on each gate stack may be removed, along with the remaining portions of the previously-deposited second poly layer and the oxide layer beneath it. Note that step 436 may involve one or more separate etching steps. When complete, however, this leaves the first poly layer in each gate structure exposed on its top surface and protected at the side by a spacer. The spacer extends above the upper boundary of the remaining poly gate electrode, this being an advantage of using the second poly layer to increase the height of the gate stack during spacer formation. The remaining photoresist is then removed (step 439).

At this point the poly gates may now be silicided. This may involve, as for example in the embodiment of FIG. 4, depositing a layer of metal (step 442). Nickel is presently preferred, though other metals may be used as well. In accordance with this embodiment of the present invention, a first rapid thermal anneal (RTA) is performed (step 445). In a preferred embodiment, the first RTA is performed at about 350° C. for approximately 1 minute. This RTA permits the combination of metal from the metal layer with the silicon in the poly layer below to form a silicide. Not all of the metal will react with the poly material, so the next operation is to remove the un-reacted excess metal (step 448). A second RTA is then performed (step 451). In a preferred embodiment, the second RTA is performed at about 500° C. for approximately 1 minute.

In this embodiment, a photoresist mask is formed and patterned to cover one of the two gate electrode (step 454), and second sacrificial oxide layer is formed (step 457), preferably to a thickness of about 40 Å. This second sacrificial layer remains in place for the boron doping of the exposed gate electrode (step 460). The boron doping is preferably done at an energy level of about 350 eV at a concentration of approximately $3 \times 10^{15}$. In another embodiment (not shown) gate electrode doping may be performed prior to silicidation.

Returning to the embodiment of FIG. 4, the remaining photoresist may then be removed (step 463). To protect the gate electrodes during source and drain silicidation, a patterned photoresist mask is formed over them (step 466). The silicidation of the source and drain regions may then be undertaken (step 469). This may be accomplished in a fashion similar to that described above in relation to the poly gate silicidation, although the steps are not separately shown in FIG. 4. The photoresist structures protecting the gate regions may then be removed (step 472). Further fabrication may then continue with the addition of a CESL layer and additional structures (not shown), and with the completion and packaging of the finished chip.

Figure 5A:
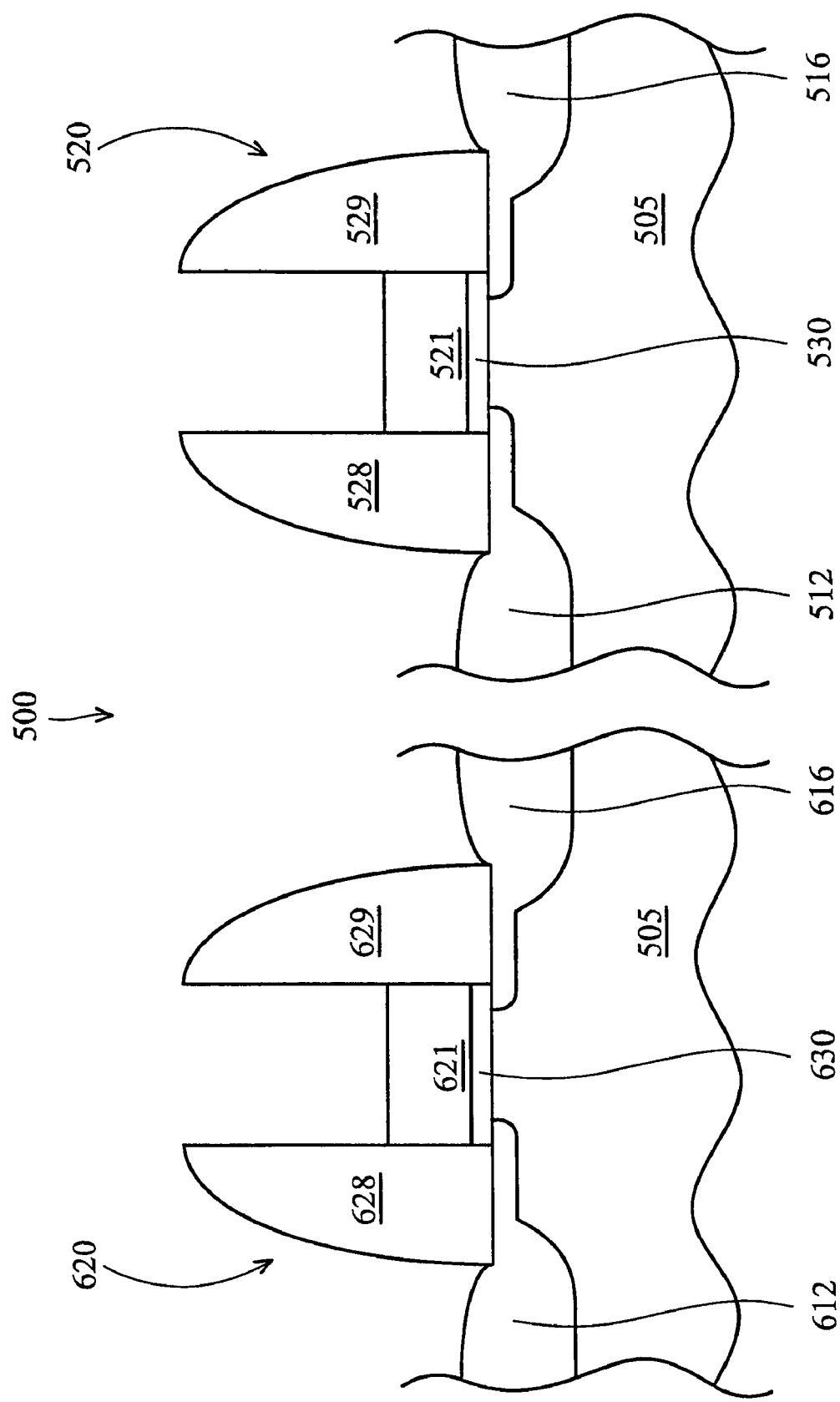
FIGS. 5a though 5d are a series of drawings illustrating in cross-section selected stages in the fabrication of PMOS device according to an embodiment of the present invention.

Another illustration of the present invention is provided in FIGS. 5a through 5d. FIGS. 5a though 5d are a series of drawings illustrating in cross-section selected stages in the fabrication of PMOS device 500 according to another embodiment of the present invention. These Figures generally though not necessarily exactly illustrate the configuration of a semiconductor device being fabricated according to the method 400 shown in FIG. 4. Because some variation may occur, the presence of a sequence or configuration in one embodiment does not necessarily require its presence in another. Illustrated in FIG. 5a are the gate structures 520 and 620 disposed on substrate 505, each having a respective gate dielectric 530 and 630, and poly gate portion 521 and 621. Dielectric spacers 528 and 529 of gate structure 520 and dielectric spacers 628 and 629 of gate structure 620 are disposed on opposite sides of their respective gate stacks. Source region 512 and drain region 516 are disposed in substrate 505 on opposite sides adjacent to gate structure 520, and source region 612 and drain region 616 are disposed in substrate 505 on opposite sides adjacent to gate structure 620. This configuration may have been achieved by a method similar to that described above in reference to steps 403 through 436 of FIG. 4.

As should be apparent, the configuration of FIG. 5a is similar though not necessarily identical to those of FIGS. 2 and 3, described above. For this reason, similar features will be numbered analogously, although the features of FIGS. 5a through 5d may be described more generally except where necessary. Note also that the location of these gates 520 and 620 relative to each other is for the purposes of explanation; this proximity is not required. In addition, the high threshold voltage gate 620 and the low threshold voltage gate 520 may be formed and treated separately instead of more or less at the same time, although the latter is preferred in most cases as being more efficient. And, as with the method of FIG. 4, described above, the steps of the sequence illustrated in reference to FIGS. 5a through 5d may be varied in any logical order; and other steps may be added or non-essential steps removes while remaining in accord with the spirit of the present invention.

Figure 5B:
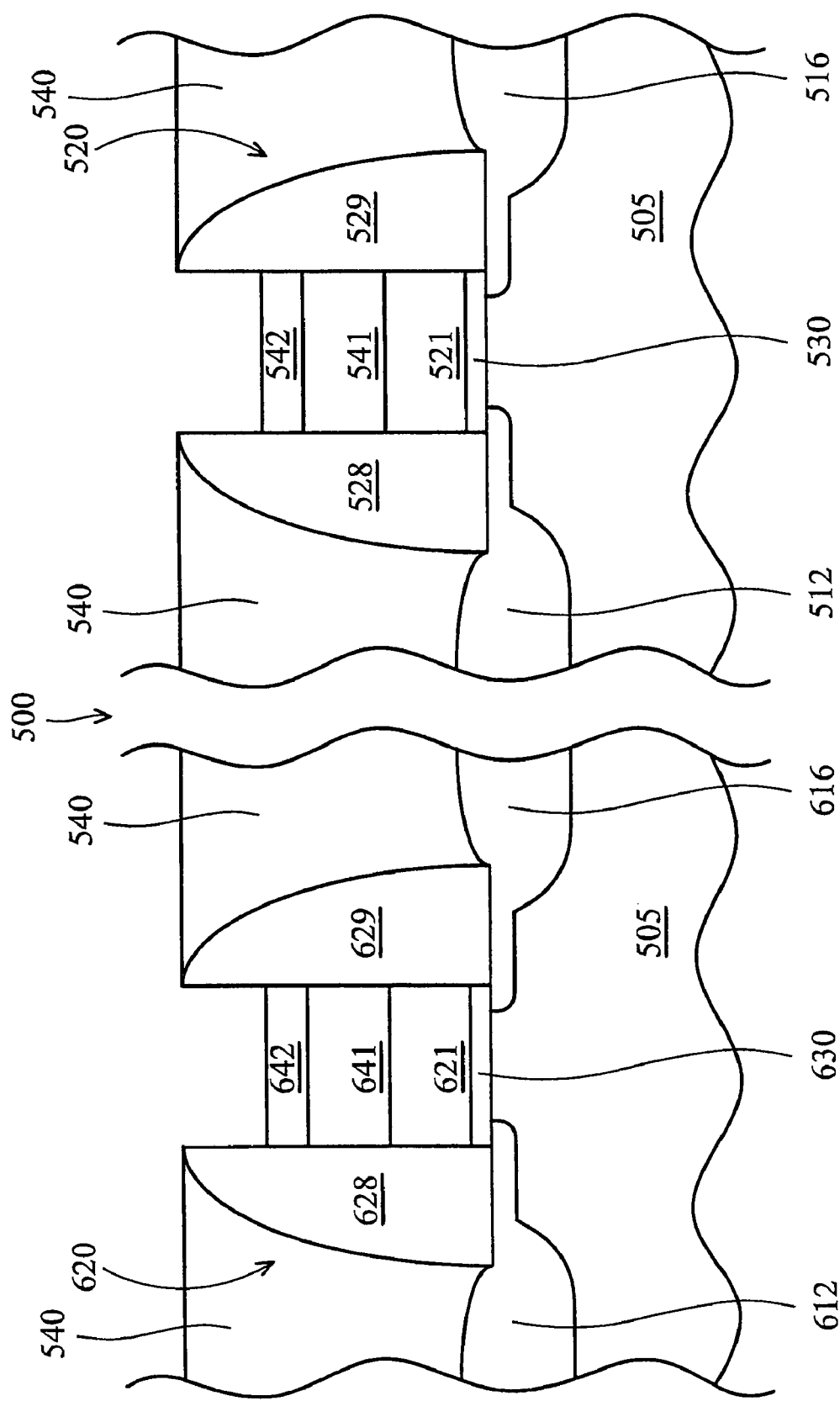
Figure 5C:
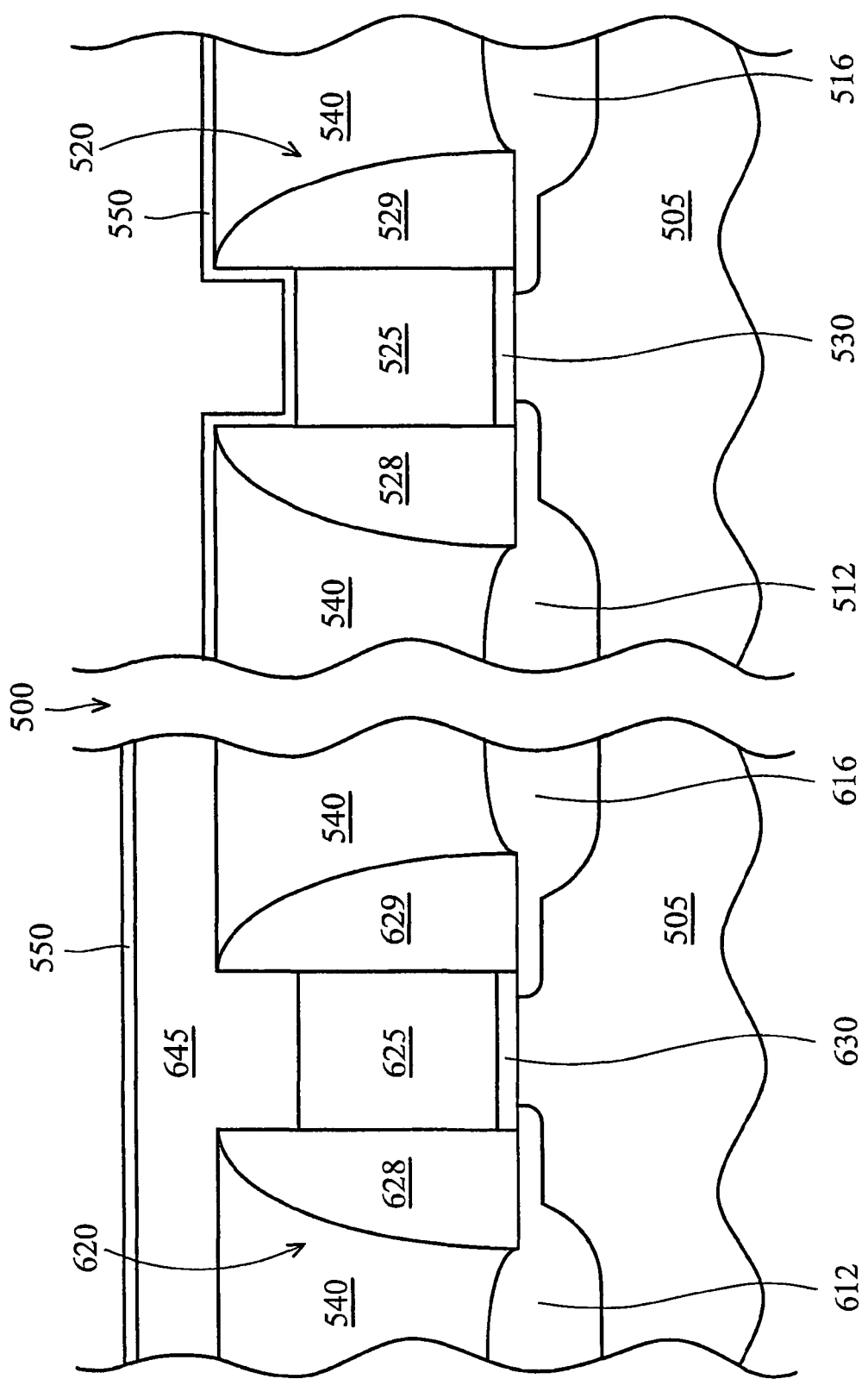

In the embodiment of FIGS. 5a through 5b, one or metal layers may then be formed over the exposed gate stack poly layers after a sacrificial oxide layer has been formed and then etched back to expose the gates. This configuration is illustrated in FIG. 5b, in which the dielectric layer 540 and the respective first metal gate portions 541 and 641, and second metal gate portions 542 and 642 are visible. In accordance with a preferred embodiment of the present invention, the metal portions 541 and 641 comprise nickel and about 5% platinum, and are approximately 220 Å thick. In this embodiment, metal portions 542 and 642 comprise titanium nitride (TiN) and are approximately 100 Å in thickness.

In this embodiment, a first and a second RTA are then performed, with any excess that is un-reacted metal being removed in between the first RTA and the second RTA. A photoresist mask 645 (see FIG. 5*c*) may then be applied and patterned to cover the gate electrode 625. A second sacrificial oxide layer 550 is then formed, again preferably to a thickness of about 40 Å. This second sacrificial layer 550, also shown in FIG. 5*c,* remains in place for the boron doping of the gate electrode 525 (corresponding to step 460 of FIG. 4). The remaining photoresist and sacrificial oxide layers may then be removed.

Figure 5D:
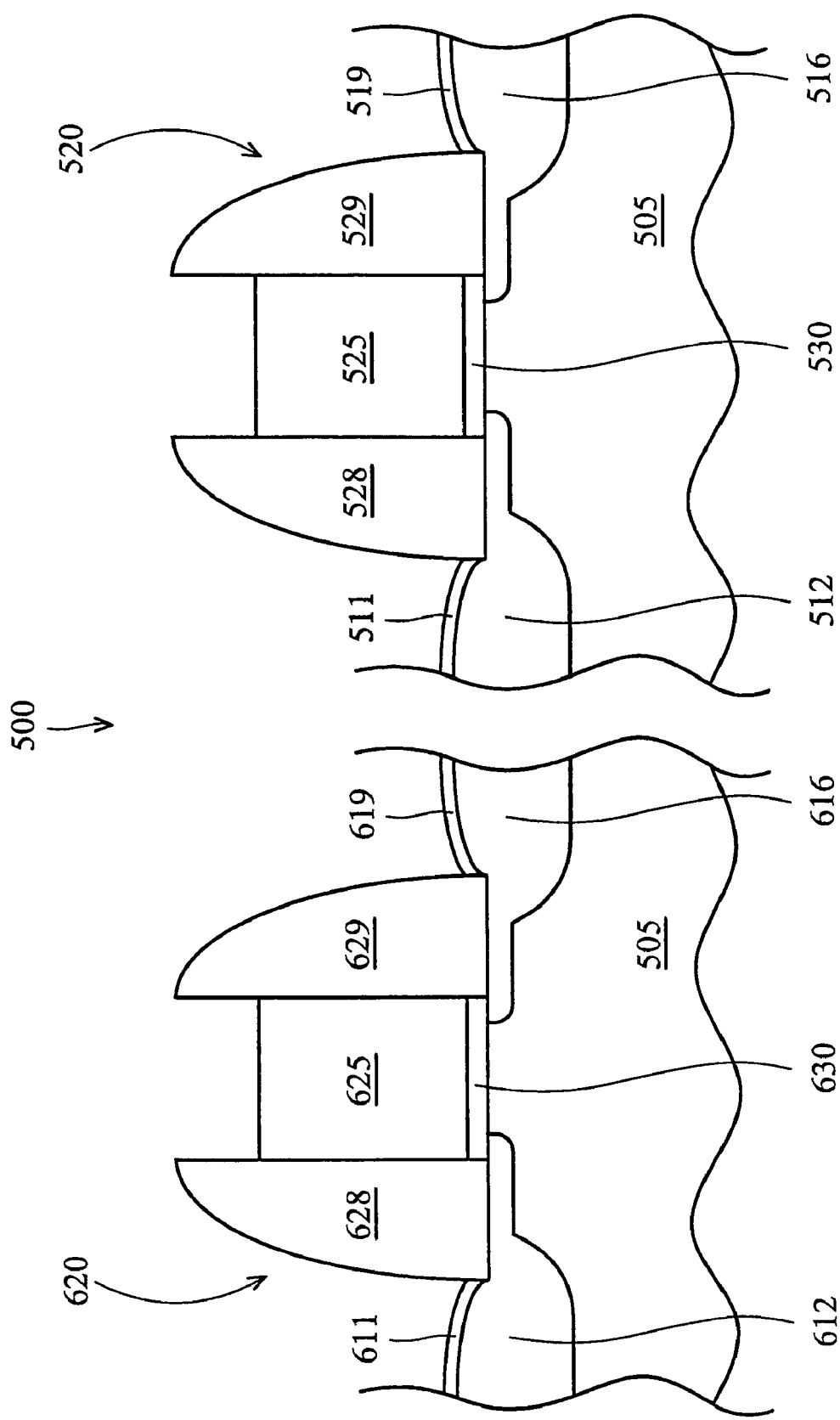

A photoresist layer is then, in this embodiment, formed and patterned to protect the gate structures during source and drain silicidation. The silicidation of the source and drain regions may then be undertaken. Source and drain silicidation proceeds similarly to the process described above in regard to gate silicidation, with the deposit of one or more metal layers, an RTA, and removal of excess metal. It is not necessary or even desirable, however, to silicide the entire source or drain region. The remaining photoresist layer is then removed; resulting configuration is illustrated in FIG. 5*d*. In FIG. 5*d,* silicide region 511 is shown disposed at the top of source region 512, and silicide region 519 is disposed at the top of drain region 516. Silicide regions 611 and 619 are similarly disposed at the top of the source region 512 and the drain region 516, respectively. At this stage, further fabrication may then continue, for example with the addition of a CESL layer and additional structures, and with the completion and packaging of the finished chip.

Although the present invention and its advantages have been described in detail, it should be understood that various changes, substitutions and alterations can be made herein without departing from the spirit and scope of the invention as defined by the appended claims. For example, other materials consistent with the devices and methods of the present invention may be used in place of those mentioned above. And method steps may be performed in any logically consistent order.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising a gate structure fabricated on a substrate, the gate structure comprising a boron-doped silicided-metal gate electrode separated from the substrate by a gate dielectric, wherein the boron-doped silicided-metal gate electrode comprises nickel and platinum and comprises a platinum peak region located near a gate dielectric interface, wherein in the platinum peak region a first platinum concentration compared to the nickel concentration is greater than about 5%, wherein the first platinum concentration in the platinum peak region is greater than a second platinum concentration in another portion of the boron-doped silicided-metal gate electrode, and wherein the gate structure and the gate dielectric form part of a PMOS transistor.

2. The semiconductor device of claim 1, wherein the platinum peak region is located within 50 Å of the gate dielectric interface.

3. The semiconductor device of claim 1, wherein the gate electrode comprises silicon and is nickel rich.

4. The semiconductor device of claim 1, wherein the gate electrode comprises a mixed NiSi and $Ni_2Si$ phase.

5. The semiconductor device of claim 1, wherein the boron-doped silicided-metal gate electrode further comprises a boron peak region.

6. The semiconductor device of claim 5, wherein the boron peak region is located within 50 Å of the gate dielectric interface.

7. The semiconductor device of claim 5, wherein the platinum peak region is closer to the gate dielectric interface than the boron peak region.

8. The semiconductor device of claim 1, wherein the gate electrode has a thickness of less than about 1000 Å.

9. The semiconductor device of claim 1, further comprising another PMOS device comprising a second gate structure, wherein the second gate structure comprises a second silicided-metal gate electrode separated from the substrate by a second gate dielectric, and wherein the second gate electrode comprises nickel and silicon in a nickel rich combination and is not boron-doped.

10. The semiconductor device of claim 9, wherein the gate dielectric comprises a high-k material.

11. The semiconductor device of claim 9, wherein the gate dielectric comprises SiOxNy material.

12. The semiconductor device of claim 9, wherein the second gate electrode comprises platinum and includes a platinum peak region where the platinum concentration compared to the nickel concentration is greater than about 5%.

13. The semiconductor device of claim 9, wherein the boron-doped gate structure is disposed adjacent to a source region and to a drain region, the source region and the drain region being formed in the substrate, and wherein the boron-doped gate structure, the source region and the drain region form a low threshold voltage transistor.

14. The semiconductor device of claim 13, wherein the source region and the drain region of the low voltage transistor define a channel longer than about 0.5 μm and has a voltage threshold of less than 0.35V.

15. The semiconductor device of claim 13, wherein the non-boron-doped second gate structure is disposed adjacent to a second source region and to a second drain region, the second source region and the second drain region being formed in the substrate, and wherein the non-boron-doped second gate structure, the second source region and the second drain region form a high threshold voltage transistor having a voltage threshold of greater than 0.35V.

16. A semiconductor device, comprising:
a first PMOS device comprising a boron-doped gate electrode; and
a second PMOS device comprising a non-boron-doped gate electrode,
wherein each gate electrode comprises platinum and a nickel rich mixture of silicon and nickel,
wherein each gate electrode comprises a platinum peak region where a first platinum concentration compared to the nickel concentration is greater than 5%, and wherein the first platinum concentration in the platinum peak region of at least one gate electrode is greater than a second platinum concentration in another portion of the at least one gate electrode.

17. The semiconductor device of claim 16, wherein the first PMOS device is a low threshold voltage device and the second PMOS device is a high threshold voltage PMOS device.

18. The semiconductor device of claim 17, wherein the first PMOS device comprises a boron peak region located less than or equal to 50 Å from a gate dielectric underlying the boron-doped gate electrode.

19. A semiconductor device, comprising:
a high threshold voltage transistor comprising a fully-silicided gate electrode;
a low threshold voltage transistor comprising a fully-silicided gate electrode, the low threshold-voltage gate electrode comprising nickel and platinum and comprising a platinum peak of greater than 5% compared to the nickel concentration,
wherein the low threshold voltage threshold transistor gate electrode is boron-doped, and wherein the high threshold voltage transistor and the low threshold voltage transistor are transistors of a same type of conductivity.

20. The semiconductor device of claim 19, wherein the low threshold voltage transistor has a threshold voltage of less than 0.35V.

* * * * *